(12) United States Patent
Noda et al.

(10) Patent No.: US 6,905,963 B2
(45) Date of Patent: Jun. 14, 2005

(54) FABRICATION OF B-DOPED SILICON FILM BY LPCVD METHOD USING BCl₃ AND SIH₄ GASES

(75) Inventors: Takaaki Noda, Tokyo (JP); Akira Morohashi, Tokyo (JP); Junji Asahi, Tokyo (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 10/255,715

(22) Filed: Sep. 27, 2002

(65) Prior Publication Data

US 2003/0077920 A1 Apr. 24, 2003

(30) Foreign Application Priority Data

Oct. 5, 2001 (JP) ........................... 2001-310146
Oct. 5, 2001 (JP) ........................... 2001-310154
Oct. 5, 2001 (JP) ........................... 2001-310201
Oct. 5, 2001 (JP) ........................... 2001-310213

(51) Int. Cl.[7] ............................................. H01L 21/44
(52) U.S. Cl. ..................... 438/684; 438/925; 438/935
(58) Field of Search ............................... 438/488, 684, 438/925, 935

(56) References Cited

U.S. PATENT DOCUMENTS 5,654,230 A * 8/1997 Jintate et al. ............... 438/684

FOREIGN PATENT DOCUMENTS

EP 0467190 1/1992

OTHER PUBLICATIONS

Fakhr–Eddine, "Application of Neural networks to modeling of Low–Pressure CVD (LPCVD) Reactors," Chemical Engineering Journal (Lausanne); vol. 72 (2), p. 171–182 (1999) (English Abstract).*

Wolf and Tauber, "Silicon Processing for the VLSI Era," vol. 1, Chapter 6, p. 179, Lattice Press (1986).*

* cited by examiner

Primary Examiner—Asok Kumar Sarkar
(74) Attorney, Agent, or Firm—Bacon & Thomas

(57) ABSTRACT

A semiconductor device fabricating method for forming a boron doped silicon film includes the step of forming the boron doped silicon film on a substrate at an inner temperature of the reaction furnace ranging from about 460 to 600° C. or at an average velocity of reaction gases in the reaction furnace being not great than about 2200 cm/min. Further, a substrate processing apparatus for forming a boron doped silicon film on a substrate includes a gas supply line for supplying $BCl_3$ to the reaction furnace. The gas supply line is installed in a portion of the reaction furnace opposite to a heater, and has an outlet for discharging $BCl_3$. The outlet of the gas supply line is provided at an upstream side of gas flow in the reaction furnace.

20 Claims, 9 Drawing Sheets

CONITION (A) : SiH₄ 100sccm, BCl₃ 5sccm
CONITION (B) : SiH₄ 250sccm, BCl₃ 5sccm
CONITION (C) : SiH₄ 500sccm, BCl₃ 5sccm

FABRICATION OF B-DOPED SILICON FILM BY LPCVD METHOD USING BCl$_3$ AND SiH$_4$ GASES

FIELD OF THE INVENTION

The present invention relates to a method for fabricating a semiconductor device and a substrate processing apparatus; and, more particularly, to a semiconductor device fabricating method and a substrate processing apparatus for forming a boron doped silicon film such as a boron doped amorphous silicon film or polysilicon film by using a low pressure CVD (Chemical Vapor Deposition) method.

BACKGROUND OF THE INVENTION

A low pressure CVD method has been widely used in forming thin films in the course of fabricating semiconductor devices, e.g., IC, LSI or the like. Such process includes deposition of a boron doped silicon film on a substrate.

In the past, diborane (B$_2$H$_6$) used to be utilized in doping boron into a silicon film by using a low pressure CVD apparatus (such as shown in FIG. 1). A boat holding a plurality of wafers vertically stacked is arranged to be loaded into a reaction furnace, and a reaction gas including diborane is introduced into the bottom region of the furnace. The reaction gas is propagated through the upper region, depositing thin films on the substrates. Such arrangement yields rather unfavorable intra-wafer non-uniformities in film thickness and specific resistance of, e.g., about 10 to 20% throughout all the regions from top to bottom.

Furthermore, inter-wafer non-uniformity in specific resistance between the bottom region and the upper region of the CVD apparatus at uniform temperature is even worse to be, e.g., about 30 to 40%. These inter-wafer non-uniformities can be reduced by having a deliberate temperature gradient across the regions or raising a film forming temperature, but raising the growth temperature may poly-crystallize films, which may result in sharp rise in the specific resistance thereof.

As a viable alternative, boron trichloride (BCl$_3$) is employed as a doping gas instead of diborane (B$_2$H$_6$), thereby considerably reducing the intra-wafer non-uniformity in film thickness. Referring to FIG. 2, there is shown a comparison of the intra-wafer non-uniformity of thickness of boron doped polysilicon films, wherein B$_2$H$_6$ gas and BCl$_3$ gas are varied as boron sources, respectively. (in both cases monosilane (SiH$_4$) gas is fixed as a silicon source) The y-axis represents intra-wafer non-uniformity in film thickness of the boron doped polysilicon in percentage and the x-axis represents the location of the wafer in the boat, in terms of the slots (see FIG. 1).

As can be clearly seen from FIG. 2, boron trichloride BCl$_3$ provides a better intra-wafer uniformity in the film thickness than the diborane B$_2$H$_6$. Even in the case of using BCl$_3$ as a doping gas, however, uniformity in the intra-wafer uniformity in the film thickness still ranges from about 5 to 6% in the bottom region (i.e., the region ranging from slot Nos. 11 to 36 in FIG. 1), which is still inadequate for use in a semiconductor device. Accordingly, there has been a continuous search for a way to improve the intra-wafer uniformity of the film thickness.

The inter-wafer uniformity in the specific resistance of the boron doped polysilicon film is considerably improved by replacing diborane B$_2$H$_6$ with boron trichloride BCl$_3$ as a source of boron. For instance, boron doped polysilicon formed by using monosilane SiH$_4$ and boron trichloride BCl$_3$ under the condition of a partial pressure of SiH$_4$ at about 63.4 Pa and a partial pressure of BCl$_3$ at about 3.2 Pa, wherein the flat film forming temperature ranges from about 400 to 420° C., yields the inter-wafer non-uniformity of the specific resistance thereof amounting to about 10%, which is also inadequate for use in a semiconductor device requiring non-uniformity to be less than 3%.

One of the major factors attributing to the inter-wafer non-uniformity in the specific resistance is the spatial non-uniformity in the partial pressure of boron trichloride BCl$_3$ in the reaction furnace. More specifically, portions of boron trichloride BCl$_3$ and monosilane SiH$_4$ that are respectively supplied into the reaction furnace are spent in forming thin films on the wafers and the rest is exhausted out of the reaction furnace, during which boron trichloride BCl$_3$ is consumed at a different rate from that of monosilane SiH$_4$, thereby resulting in a non-uniform partial pressure of boron trichloride BCl$_3$ within the reaction furnace. Accordingly, it is of a practical concern to provide a condition for obtaining uniform inter-wafer specific resistance, e.g., irrespective of partial pressure of boron trichloride BCl$_3$.

SUMMARY OF THE INVENTION

It is, therefore, an object of the present invention to provide a method for fabricating a semiconductor device and a substrate processing apparatus, capable of forming a boron doped silicon film having an improved intra-wafer uniformity in film thickness.

Further, it is another object of the present invention to provide a method for fabricating a semiconductor device and a substrate processing apparatus, capable of forming a boron doped silicon film having an improved inter-wafer uniformity in specific resistance.

In accordance with a preferred embodiment of the present invention, there is provided a semiconductor device fabricating method for forming a boron doped silicon film on one or more substrates in a reaction furnace of a low pressure CVD apparatus by using SiH$_4$ and BCl$_3$ as reaction gases, comprising the steps of:

loading said one or more substrates into the reaction furnace; and forming the boron doped silicon film on said one or more substrates at an inner temperature of the reaction furnace ranging from about 460 to 600° C.

In accordance with another preferred embodiment of the present invention, there is provided a semiconductor device fabricating method for forming a boron doped silicon film on one or more substrates in a reaction furnace of a low pressure CVD apparatus by using SiH$_4$ and BCl$_3$ as reaction gases, comprising the steps of:

loading said one or more substrates into the reaction furnace; and forming the boron doped silicon film on said one or more substrates at an average velocity of the reaction gases in the reaction furnace being not greater than about 2200 cm/min.

In accordance with still another preferred embodiment of the present invention, there is provided a semiconductor device fabricating method for forming a boron doped silicon film on a substrate in a reaction furnace of a low pressure CVD apparatus by using SiH$_4$ and BCl$_3$ as reaction gases, comprising the steps of:

loading a boat holding the substrate into the reaction furnace, the substrate being vertically stacked in the boat; and forming the boron doped silicon film with the reaction gases supplied to the reaction furnace through a bottom part thereof and then flowing upward, wherein an average velocity of the reaction gases is controlled such that an intra-substrate thickness non-uniformity of the boron doped silicon film on the substrate is not greater than about 3%.

In accordance with still another preferred embodiment of the present invention, there is provided a semiconductor device fabricating method for forming a boron doped silicon film on one or more substrates in a reaction furnace of a low pressure CVD apparatus by using $SiH_4$ and $BCl_3$ as reaction gases, comprising the steps of:

loading said one or more substrates into the reaction furnace; and forming the boron doped silicon film on said one or more substrates at a partial pressure of $BCl_3$ in the reaction furnace not greater than about 0.7 Pa.

In accordance with still another preferred embodiment of the present invention, there is provided a semiconductor device fabricating method for forming a boron doped silicon film on one or more substrates in a reaction furnace heated by a heater unit of a low pressure CVD apparatus by using $SiH_4$ and $BCl_3$, comprising the steps of:

loading said one or more substrates into the reaction furnace; and supplying $SiH_4$ and $BCl_3$ into the reaction furnace via a first gas supply line and a second gas supply line respectively, wherein the second gas supply line has a vertically extended portion and an outlet inside the reaction furnace, the extended portion facing the heater unit, so that $BCl_3$ is heated by the heater unit, while passing through the extended portion, and heated $BCl_3$ being discharged into the reaction furnace through the outlet, the outlet being provided at an upstream side of a gas flow in the reaction furnace.

In accordance with still another preferred embodiment of the present invention, there is provided a substrate processing apparatus, comprising:

a reaction tube in which at least one substrate is processed;

a heater unit, provided outside of the reaction tube, for heating said at least one substrate;

a first gas supply line for supplying $SiH_4$ to the reaction furnace; and a second gas supply line for supplying $BCl_3$ to the reaction furnace, wherein the second gas supply line has a vertically extended portion and an outlet inside of the reaction tube, the extended portion facing the heater unit so that $BCl_3$ is heated by the heater unit, while passing through the extended portion, and the heated $BCl_3$ gas being discharged into the reaction tube through the outlet, the outlet being provided at an upstream side of a gas flow in the reaction tube.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

It has been found that a conventionally grown boron doped polysilicon film at a bottom region of a reaction furnace tends to have an intra-wafer non-uniformity in a film thickness of about 5 to 6%, wherein the film gets thinner as the distance from the center portion of the wafer increases toward the edge thereof. In view of a catalytic effect of boron contributing to the increase in the film growth rate, it may be considered that, a decomposition of a boron trichloride ($BCl_3$) gas at the edge portion of the wafer is slowly achieved, whereas as it is diffused toward the center portion of the wafer, its decomposition takes place more vigorously, thereby resulting in a greater thickness in the center portion.

Such phenomenon may be considered to occur due to a temperature distribution within the reaction furnace. However such explanation may not be relied upon, in view of the fact that the temperature in the reaction furnace is stabilized after a period of time and the removal of the dummy wafers has no bearing on the intra-wafer uniformity in film thickness. Thus one can safely conclude that the temperature distribution in the reaction furnace is not a primary factor affecting the intra-wafer uniformity in film thickness.

When boron trichloride $BCl_3$ is sufficiently heated before entering the bottom region, decomposition readily occurs on a surface of a wafer, and the intra-wafer uniformity in thickness is considerably improved.

Figure 1:
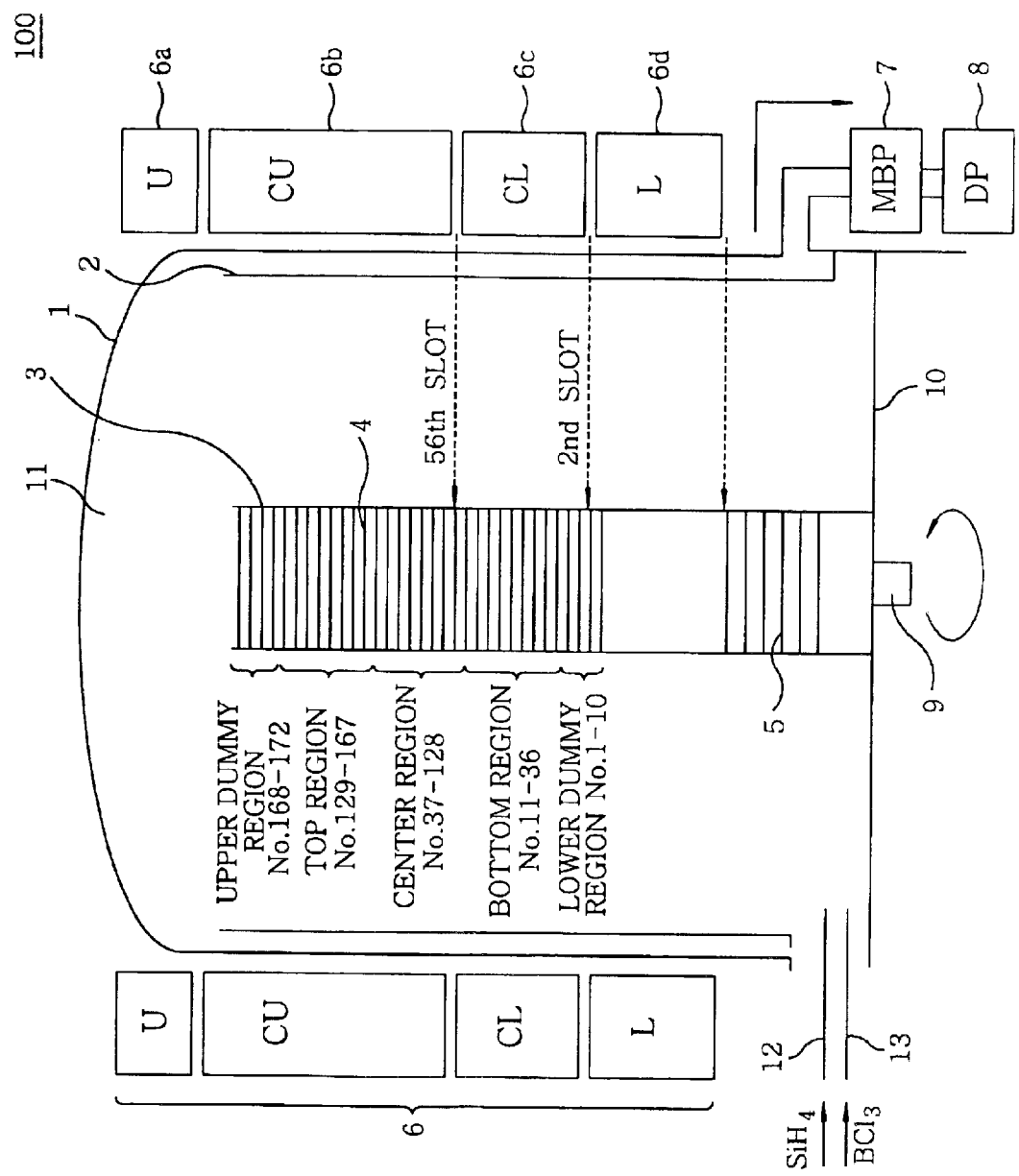
FIG. 1 shows a schematic view of a vertical batch type low pressure CVD apparatus employed in the present invention.
Figure 2:
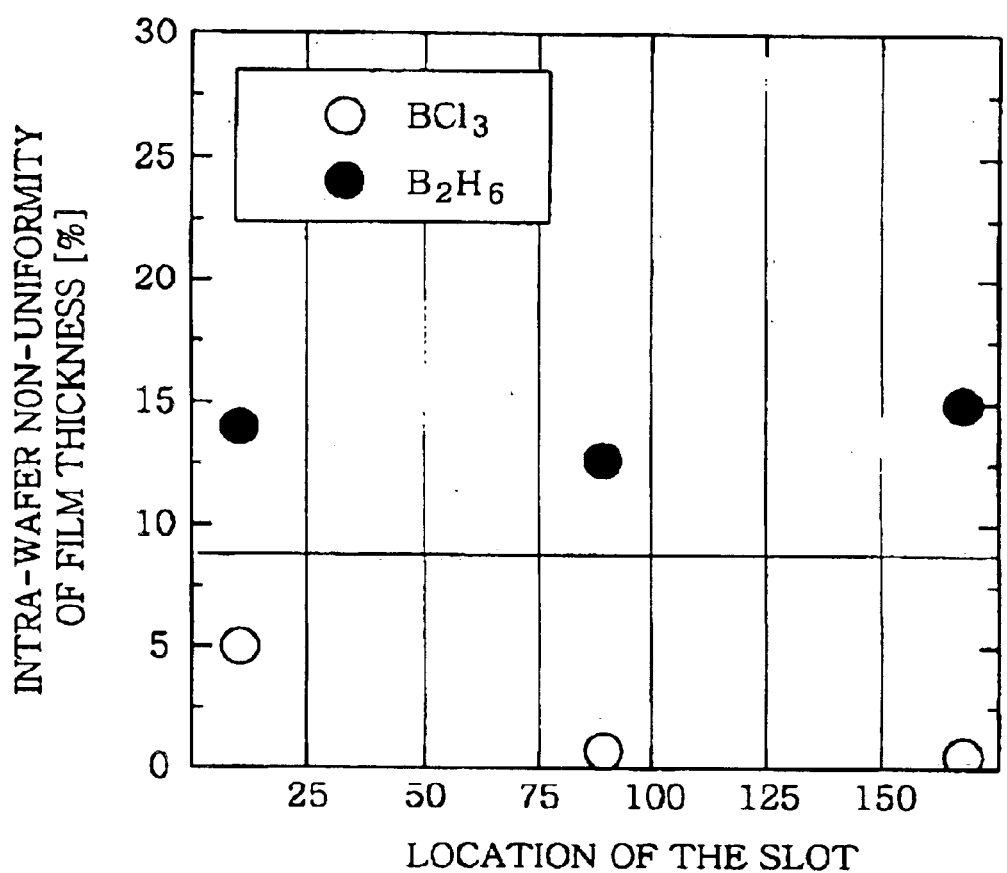
FIG. 2 is a view setting forth the intra-wafer non-uniformity in film thickness of a boron doped polysilicon film obtained when using $SiH_4$ as a silicon source, and $B_2H_6$ and $BCl_3$ as boron source respectively.

Referring to FIG. 1, there is shown a schematic view of a hot wall vertical batch type low pressure CVD apparatus 100, in which a thin boron doped amorphous or polycrystalline silicon film is produced on a wafer by using monosilane ($SiH_4$) and boron trichloride ($BCl_3$) as reaction gases.

The CVD apparatus 100 includes a reaction furnace 11, i.e., an outer tube 1 made of quartz functioning as an outer shell of the reaction furnace 11, and an inner tube 2 vertically disposed inside of the outer tube 1, wherein the dimensions of the tubes 1 and 2 are as follows: the inner tube 2 having a length ranging from about 1250 to about 1260 mm and a diameter ranging from about 250 to about 270 mm; and the outer tube 1 having a length ranging from about 1270 to about 1280 mm and a diameter ranging from about 290 to about 310 mm. Furthermore, there is provided a boat rotational shaft 9 and a stainless cover 10 in the reaction furnace 11.

Provided around the sidewall of the outer tube 1 is a heater unit 6 included in a hot-wall furnace. The heater 6 for heating a wafer loaded in the reaction furnace 11 is divided into four zones, as will be described later.

The outer tube 1 encloses the inner tube 2, with a spacing provided therebetween, wherein the spacing provided between the tubes 1 and 2 is vacuum evacuated by a mechanical booster pump (MBP) 7 and a dry pump (DP) 8. Accordingly, the reaction gas introduced into the inner tube 2 flows upwards therein and pumped out from the reaction furnace 11 after passing down through the space between the tubes 1 and 2.

Disposed in the inner tube 2 is a quartz boat 3 holding a plurality of horizontally disposed wafers 4 with their centers vertically aligned. The wafers 4 are exposed to the reaction gas introduced, so that a thin boron doped silicon film is deposited on a wafer 4 by the gas phase and the surface reaction of the reaction gas. Further, the boat 3 contains insulation plates 5 at a lower part thereof, in order to provide uniform temperature distribution of the wafer 4 disposed thereabove.

The boat 3 is provided with vertically arranged 172 slots for horizontally supporting the wafers 4. The wafer mounting slots are divided into an upper dummy region, a top region, a center region, a bottom region, and a lower dummy region. The lower dummy region ranging from the lowest slot up to the 10th slot and the upper dummy region ranging from the 168th slot up to the 172nd slot, are filled with dummy wafers. The bottom region ranging from the 11th slot to the 36th slot, the center region ranging from the 37th slot to the 128th slot, and the top region ranging from the 129th slot to the 167th slot are loaded with product wafers.

The heater unit 6 is divided into four zones of a U (upper) zone 6a, a CU (center upper) zone 6b, a CL (center lower) zone 6c, and an L (lower) zone 6d. The L zone 6d corresponds to a lower region of the boat 3 up to the lowest slot thereof. Therefore, there exists only one dummy wafer in a region of the boat 3 corresponding to the L zone 6d. The CL zone 6c corresponds to a region from the 2nd slot to the 56th slot where the dummy and the product wafers coexist; the CU zone 6b corresponds to a region from the 57th slot to the 172nd slot where the dummy and the product wafers also coexist; and the U zone 6a disposed above the CL zone 6b corresponds to a region above the uppermost region of the boat 3 where no wafer exists.

The lower part of the boat 3 is further provided with insulation plate mounting slots installing the insulation plates 5. For example, the number of insulation plate mounting slots is seven.

A monosilane $SiH_4$ gas supply line 12 and a $BCl_3$ gas supply line 13 made of quartz are installed at an inlet of the reaction furnace 11 together, wherein the reaction furnace inlet is provided at a bottom portion of the reaction furnace 11 below the heater unit 6, e.g., a left bottom portion of the reaction furnace 11, as shown in FIG. 1. The insulation plates 5 are installed at a position lower than the L zone 6d.

Figure 3:
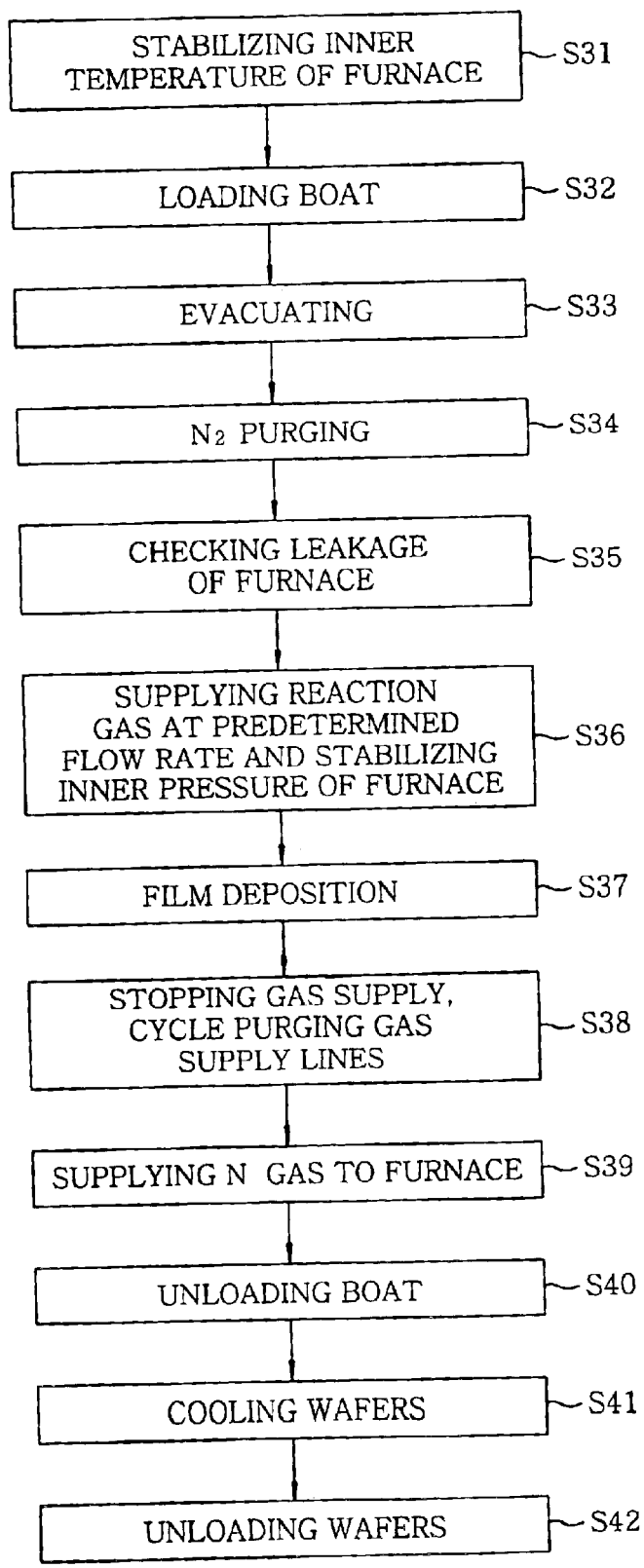
FIG. 3 depicts a flow chart of a process for depositing a thin film by using the apparatus shown in FIG. 1.

Referring to FIG. 3 there is shown a flow chart of a process for depositing a thin film by using the apparatus 100 shown in FIG. 1.

After the inner temperature in the reaction furnace 11 being stabilized at a thin film forming temperature (step S31), the boat 3 holding the wafers 4 is loaded into the reaction furnace 11 (step S32). Thereafter, the reaction furnace 11 is evacuated (step S33) and $N_2$ purge gas is fed into the reaction furnace 11 to remove moisture or the like on the boat 3, the inner tube 2, and the outer tube 1 (step S34). A leakage check in the reaction furnace 11 is then performed (step S35). Subsequently, $SiH_4$ and $BCl_3$ are supplied at predetermined respective flow rates to stabilize the inner pressure in the reaction furnace 11 (step S36). Consequently, the boron doped silicon film, i.e., the boron doped amorphous silicon film or the boron doped polysilicon film is formed on the wafer 4 (step S37). After the completion of film depositing, the supply of the reaction gas is cut off and a cycle purge operation is performed to clear the gas supply lines (step S38) and the inner pressure in the reaction furnace 11 is returned to the atmospheric pressure by the supply of the $N_2$ gas. (step S39). Thereafter, the boat 3 is unloaded from the reaction furnace 11 (step S40), to perform natural cooling of the wafers 4 (step S41). Finally, the wafers 4 are unloaded from the boat 3 (step S42).

EXAMPLE 1

Raising a Film Forming Temperature

Figure 4:
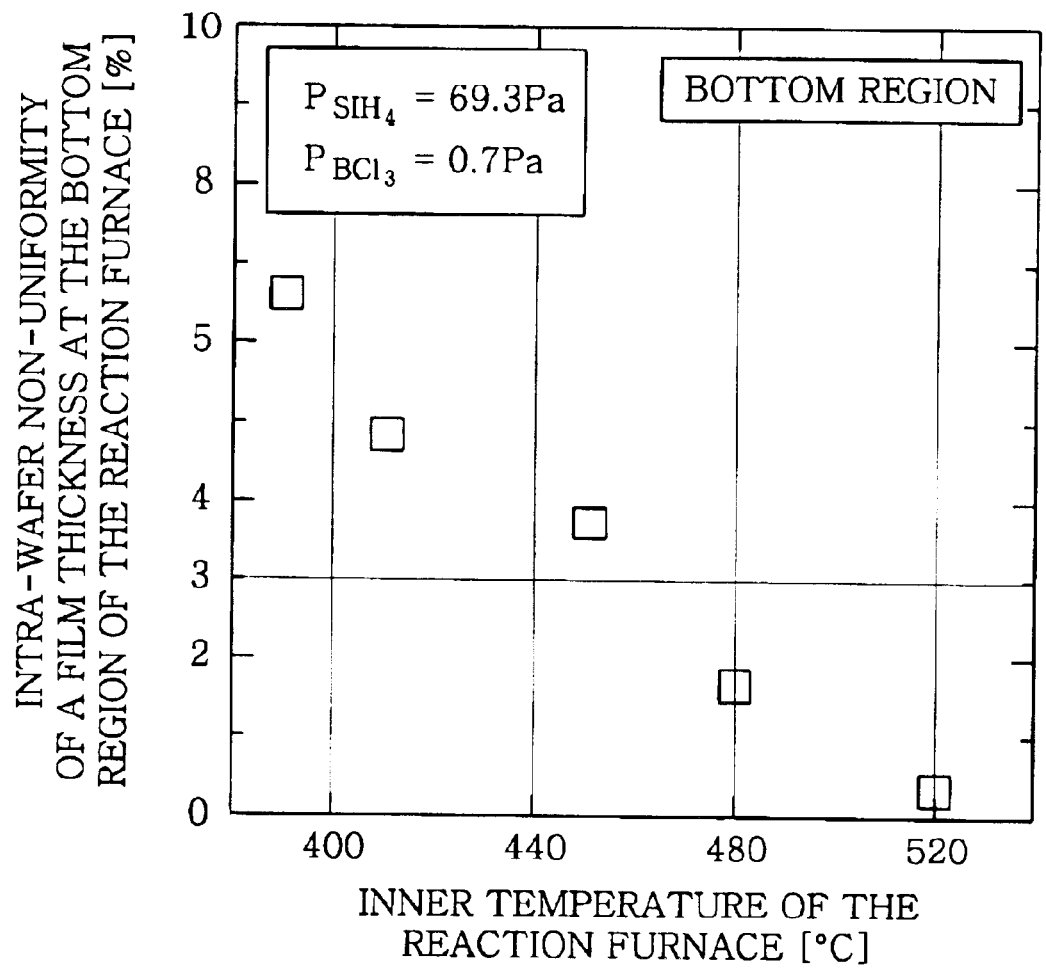
FIG. 4 presents a graph illustrating a relationship between a film growth temperature and an intra-wafer non-uniformity in a film thickness at a bottom region of the reaction furnace.

Referring to FIG. 4, there is shown a graph illustrating a relationship between an intra-wafer non-uniformity in film thickness and an inner temperature in the reaction furnace 11. The x-axis represents the inner temperature of the reaction furnace 11 and the y-axis represents the intra-wafer non-uniformity in a film thickness in percentage. The partial pressures of $SiH_4$ and $BCl_3$ were fixed at 69.3 Pa and 0.7 Pa respectively, and the corresponding flow rates thereof were 500 sccm and 5 sccm, respectively.

As shown in FIG. 4, the decomposition of $BCl_3$ was facilitated by raising the inner temperature of the reaction furnace 11 (or the film forming temperature), and in particular, an improved intra-wafer uniformity in film thickness was obtained at a temperature equal to or greater than about 480° C.

Depending on the type of application of the semiconductor device, about 3% or less intra-wafer non-uniformity in thickness may suffice for the purpose of some applications, in which case, the most desirable results can be achieved at a temperature that is higher than about 460° C. for example at 480° C. In which case, the intra-wafer non-uniformity in film thickness at the bottom region becomes not greater than about 3% at 400° C. or about 2% at 480° C. By further raising the film forming temperature to higher than about 520° C., the intra-wafer non-uniformity in film thickness at the bottom region becomes not greater than about 1%.

However, raising the film forming temperature to higher than about 600° C., makes the specific resistance increase sharply due to a deficiency of $BCl_3$ and furthermore the intra-wafer uniformity in the film thickness at the top and the center region may be deteriorated. Therefore, the desired film forming temperature is preferably not higher than about 600° C.

Thus, in order to keep the specific resistance constant, while reducing the intra-wafer non-uniformity in the film thickness, the inner temperature of the reaction furnace 11 is preferably from about 460° C. to 600° C., and more preferably from 480° C. to 600° C.

The wafers in the bottom region (slot Nos. 11 to 36) that were previously abandoned in the production line due to a high intra-wafer non-uniformity in film thickness (approximately 5 to 6%) can be re-introduced into the production line when the intra-wafer non-uniformity in the film thickness is significantly reduced to about 1%, by raising the film forming temperature, thereby greatly enhancing the productivity.

EXAMPLE 2
Reduction in Gas Flow Rate

The above discussions refer to a situation where the decomposition of $BCl_3$ is facilitated by raising the inner temperature of the reaction furnace, thereby improving the intra-wafer uniformity in the film thickness. However, depending on the type of application of the semiconductor device, some devices require the film forming process temperature to be not greater than about 440° C. In such case, decomposition of $BCl_3$ needs to be facilitated without raising the inner temperature of the reaction furnace. The present invention offers a new approach in facilitating decomposition of $BCl_3$, wherein facilitating the decomposition thereof is achieved by controlling (i.e., reducing) a gas flow rate thereof.

Figure 5:
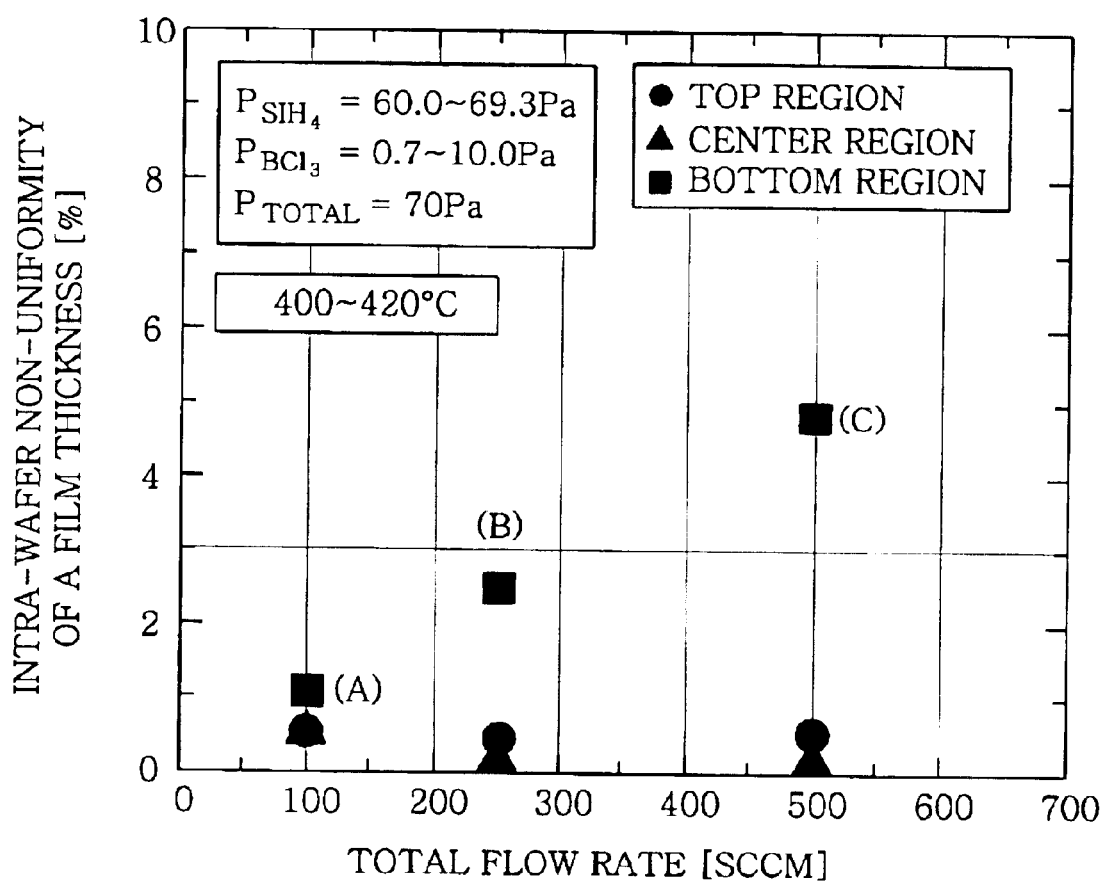
FIG. 5 describes a graph illustrating a relationship between an intra-wafer non-uniformity in film thickness and a gross flow rate of $SiH_4$ and $BCl_3$.

Referring to FIG. 5, there is illustrated a graph illustrating a relationship between an intra-wafer non-uniformity in a film thickness and a total flow rate of $SiH_4$ and $BCl_3$. The x-axis represents the total flow rate of $SiH_4$ and $BCl_3$ and the y-axis represents an intra-wafer non-uniformity in film thickness in percentage. The inner temperature of the reaction furnace was varied from about 400 to 420° C., and the flow rate of $SiH_4$ was reduced from about 500 to 100 sccm under the condition of a constant flow rate of $BCl_3$, e.g., 5 sccm. The partial pressures of $SiH_4$ and $BCl_3$ ranged from about 60.0 to 69.3 Pa and from about 0.7 to 10.0 Pa, respectively, yielding a gross pressure of $SiH_4$ and $BCl_3$ of about 70 Pa.

As the flow rate was reduced, while keeping the gross partial pressure constant, the time it took for $BCl_3$ to reach the bottom region from the entrance of the reaction furnace was extended, which in turn extended the amount of heating time for $BCl_3$. Thus, the reduction of the total gas flow rate facilitated the decomposition of $BCl_3$, which in turn reduced the intra-wafer non-uniformity in film thickness, as in the case of raising the film growth temperature. As shown in FIG. 5, as the flow rate was reduced from 500 sccm (C) to 100 sccm (A), the intra-wafer non-uniformity in the film thickness in all of the top, center, and bottom regions of the furnace was significantly reduced down to about 1%. The positions of the wafers in three regions employed in measuring the intra-wafer uniformity in the film thickness were the 11th, 89th and 167th wafer slots.

As mentioned above, intra-wafer non-uniformity in the film thickness not greater than about 3% is acceptable for certain devices depending on their application. Therefore, in such a case, the film formation may be carried out under the condition (B), in which the gross flow rate of $SiH_4$ and $BCl_3$ is about 255 sccm.

FIG. 5 further illustrates the intra-wafer non-uniformity in the film thickness of about 3% that can be obtained by controlling the gross flow rate to be not greater than about 300 sccm. More specifically, if the cross-sectional area of the gas flow path and the gas flow rate are 531 $cm^2$ and 300 sccm, respectively, the velocity of the gas is 2200 cm/min at the gross pressure of 70 Pa, and the film forming temperature ranging from about 400 to 420° C. Accordingly, if the film formation is performed at an average velocity not greater than 2200 cm/min, it causes intra-wafer non-uniformity in polysilicon film thickness not greater than 3% for all the wafers in the entire reaction furnace.

Further, controlling the gross flow rate to be not greater than 200 sccm and 100 sccm, the intra-wafer non-uniformities in the film thickness not greater than 2% and 1% are obtained, respectively, wherein when the total flow rate is about 200 sccm and 100 sccm, the average gas velocity is about 1470 cm/min and 730 cm/min, respectively. Accordingly, if the film formation is performed at an average gas velocity not greater than 1470 cm/min, a deposit film having the intra-wafer non-uniformity in film thickness of at most 2% can be obtained for a boron doped polysilicon film in the entire region of the reaction furnace; if not less than 730 cm/min, the infra-wafer non-uniformity in film thickness not greater than about 1% is achieved.

Further, if an average gas flow velocity ranging from about 730 to 2200 cm/min is selected, a boron doped silicon film on a wafer located anyplace in the entire reaction furnace is produced with an intra-wafer non-uniformity in thickness ranging from about 1 to 3%.

It has been found that at film forming temperature of from about 380 to 400° C., the variables: partial pressure of $BCl_3$; gross partial pressure; and the number of insulation plates, bear no dependence on the intra-wafer uniformity in thickness in the bottom region. Based on the above findings, it has been determined that the average gas velocity and the film forming temperature bear a significant dependence on the intra-wafer uniformity in film thickness in the bottom region of the reaction furnace 11.

Referring to FIG. 4 setting forth the example 1 of the present invention, the corresponding average gas velocity at film forming temperature of 390° C. was 3510 cm/min, 3620 cm/min at 410° C., 3830 cm/min at 450° C., 3990 cm/min at 480° C., and 4200 cm/min at 520° C. Furthermore, under the same conditions, the corresponding average gas velocity was 3890 cm/min at 460° C. and 4630 cm/min at 600° C. As mentioned above, the intra-wafer uniformity in film thickness in the bottom region was governed by average gas velocity and the film processing temperature, and in particular, low average gas velocity and high film forming temperature improved the intra-wafer uniformity in film thickness in the bottom region. Thus, by having a minimum film forming temperature of 460° C. and average gas velocity not greater than 3890 cm/min, films were produced with intra-wafer non-uniformity of film thickness in the bottom region less than 3%. Furthermore, by having film forming temperature of at least 480° C. and average gas velocity of not greater than 3990 cm/min, one could achieve intra-wafer uniformity in film thickness in the bottom region less than 2%. Accordingly, by having film forming temperature of at least 520° C. and average gas velocity of not more than 4200 cm/min, yields the intra-wafer uniformity of film thickness in the bottom region of less than 1%.

The example 2 in accordance with the present invention was performed at a film forming temperature of about 400 to 420° C. as shown in FIG. 5. As mentioned above, the average gas velocity and the film forming temperature were the crucial factors in determining the intra-wafer film thickness in the bottom region. In particular, high film forming temperature and low average gas velocity improved in the intra-wafer uniformity in film thickness in the bottom region. Therefore, by having film forming temperature of at least 400° C. and average gas velocity of reaction gas not more than 2200 cm/min, the intra-wafer non-uniformity of film thickness in all the regions could be reduced to be less than 3%, whereas by having film forming temperature of at least 400° C. and average gas velocity of not greater than 1470 cm/min, the intra-wafer non-uniformity in film thickness was able to be reduced to less than 2% in all the regions. Further, the intra-wafer non-uniformity in film thickness was able to be kept to be less than 1% in all the regions while having film forming temperature of about 400° C. and average gas velocity of not greater than 730 cm/min. In both the example 1 and 2, it was preferable to establish film forming temperature not greater than 600° C. and this example 1 is more preferable for applications requiring low processing temperature, e.g., 440° C.

In comparison, the intra-wafer non-uniformity in film thickness in the bottom region (slot Nos. 11–36) in the prior art was about 5 to 6%, which did not meet the product specifications of many applications, thus were abandoned in the production line. However, in the present invention, the intra-wafer non-uniformity of the film thickness in the bottom region was improved to about 1% by lowering the gas velocity, thereby considerably improving the productivity. This process of reducing intra-wafer non-uniformity in film thickness by employing low gas velocity may be of a particular interest to those semiconductor devices that require low temperature processing.

EXAMPLE 3

Preheating of $BCl_3$

Figure 6:
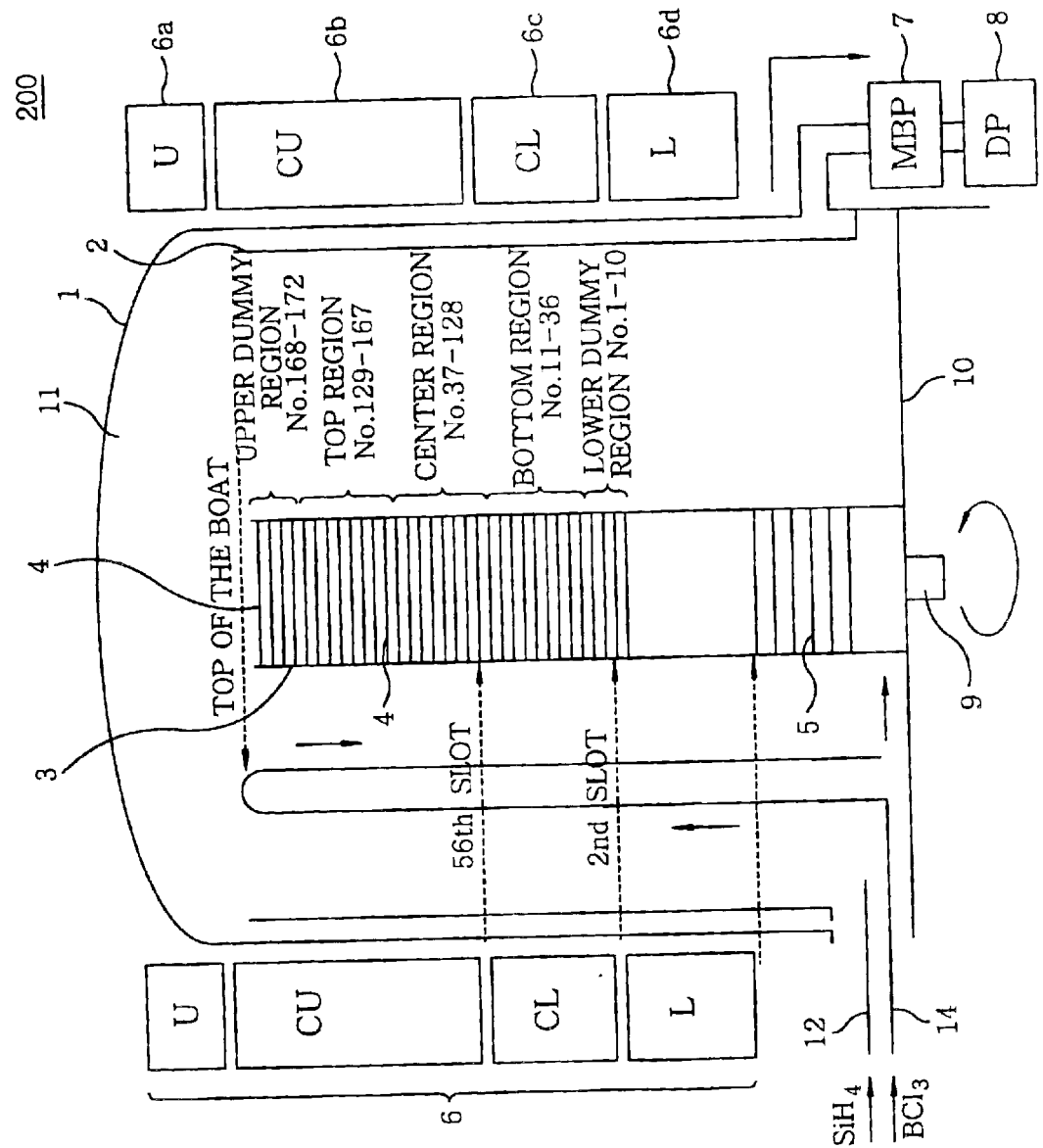
FIG. 6 offers a schematic view of a vertical batch type low pressure CVD apparatus in accordance with the present invention.

Referring to FIG. 6, there is shown a schematic view of the vertical batch type low pressure CVD apparatus 200 in accordance with a third preferred embodiment of the present invention. The apparatus 200 of the third preferred embodiment was similar to that 100 of the first and the second preferred embodiment with the exception of a return line 14, which was used to supply $BCl_3$. Therefore, the return line 14 will now be described in detail with reference to the accompanying drawings, wherein like parts appearing in FIGS. 1 and 6 are represented by like reference numerals and descriptions thereof are omitted for simplicity.

As shown, $SiH_4$ was supplied to a reaction furnace 11 via a $SiH_4$ supply line 12, which was in the lower region of the reaction furnace 11, more specifically, below the heater unit 6, similar to that of the first embodiment. In a similar manner, $BCl_3$ was supplied through the $BCl_3$ supply line 14, which was formed in a shape of an inverted U-shape. $BCl_3$ entered through the supply line 14 at the bottom region of the reaction furnace 11 and exited at a corresponding level thereof. The bend of the supply line 14 was at a maximum height of the supply line 14, which corresponded to the top of the boat 3. The supply line 14, which was extended from the bottom region of the furnace 11 to the bend and back down to the bottom, prolonged the time spent on heating $BCl_3$. The heated $BCl_3$ was released to the bottom region of the reaction furnace 11, at the upper streamside of the gas flow.

The supply line 14 was made of quartz and a total length of the U-shaped portion thereof was 2.6 m, wherein its inner diameter was about 4 mm. It was found that the supply line 14 contributed to improving uniformity in intra-wafer thickness by approximately 10% in comparison with the case using the conventional supply line 13 shown in FIG. 1, under the baron doped polysilicon growth conditions of: the inner temperature of the reaction furnace 11 maintained at about 390° C., the film forming pressure kept at about 70 Pa, the flow rates of $SiH_4$ and $BCl_3$ of about 500 sccm and about 5 sccm, respectively, without using dilution gas.

By heating the return line 14 and extending its travel path to the bottom region of the reaction furnace 11, it prolonged the time it took for $BCl_3$ to reach thereto. Thus, $BCl_3$ was sufficiently heated, facilitating the decomposition of $BCl_3$ on surfaces of the wafers 4.

Further, the inner diameter of the return line 14 can be expanded, in order to reduce the gas flow velocity of $BCl_3$, which in turn extends the heating time of $BCl_3$, consequently, facilitating the decomposition of $BCl_3$.

Figure 7C:
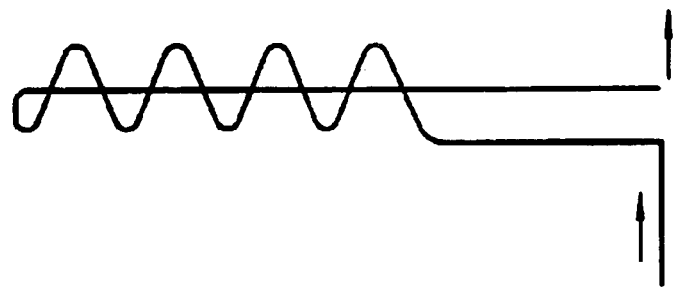
FIGS. 7A to 7C provide modifications of a return line of the low pressure CVD apparatus shown in FIG. 6 of the present invention.
Figure 7B:
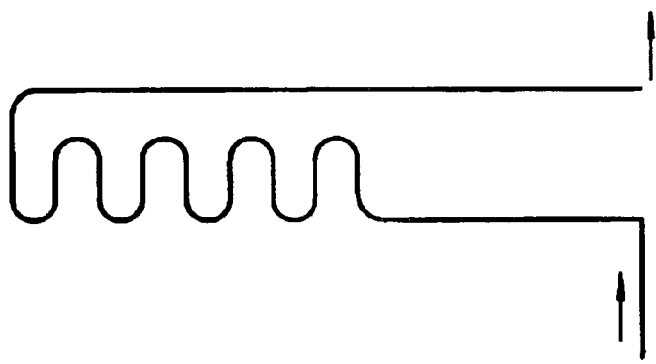
Figure 7A:
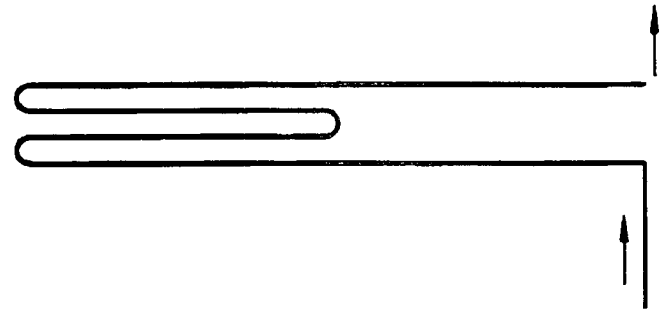

Referring to FIGS. 7A to 7C, there are shown exemplary modifications of the supply line 14 where a W-shaped return line (see FIG. 7A), a comb-shaped return line (see FIG. 7B), and a helical-shaped return line (see FIG. 7C) are illustrated respectively. These return lines inherit the same principle as the return line in FIG. 6, in that they serve to prolong the exposure of $BCl_3$ to heat source prior to being introduced in the reaction furnace 11. However, as shown in FIGS. 7A to 7C, shape or form can be varied, specifically, the travel path may be designed to further extend the exposure to the heat source. The arrows indicate flow directions of the gas. Furthermore, the right arrows indicate where the gas is discharged from the respective supply lines in FIGS. 7A to 7C at the upper streamside of the gas flow in the reaction furnace 11. Furthermore, the number of outlets may be tailored to meet the needs of the application.

EXAMPLE 4

Figure 8:
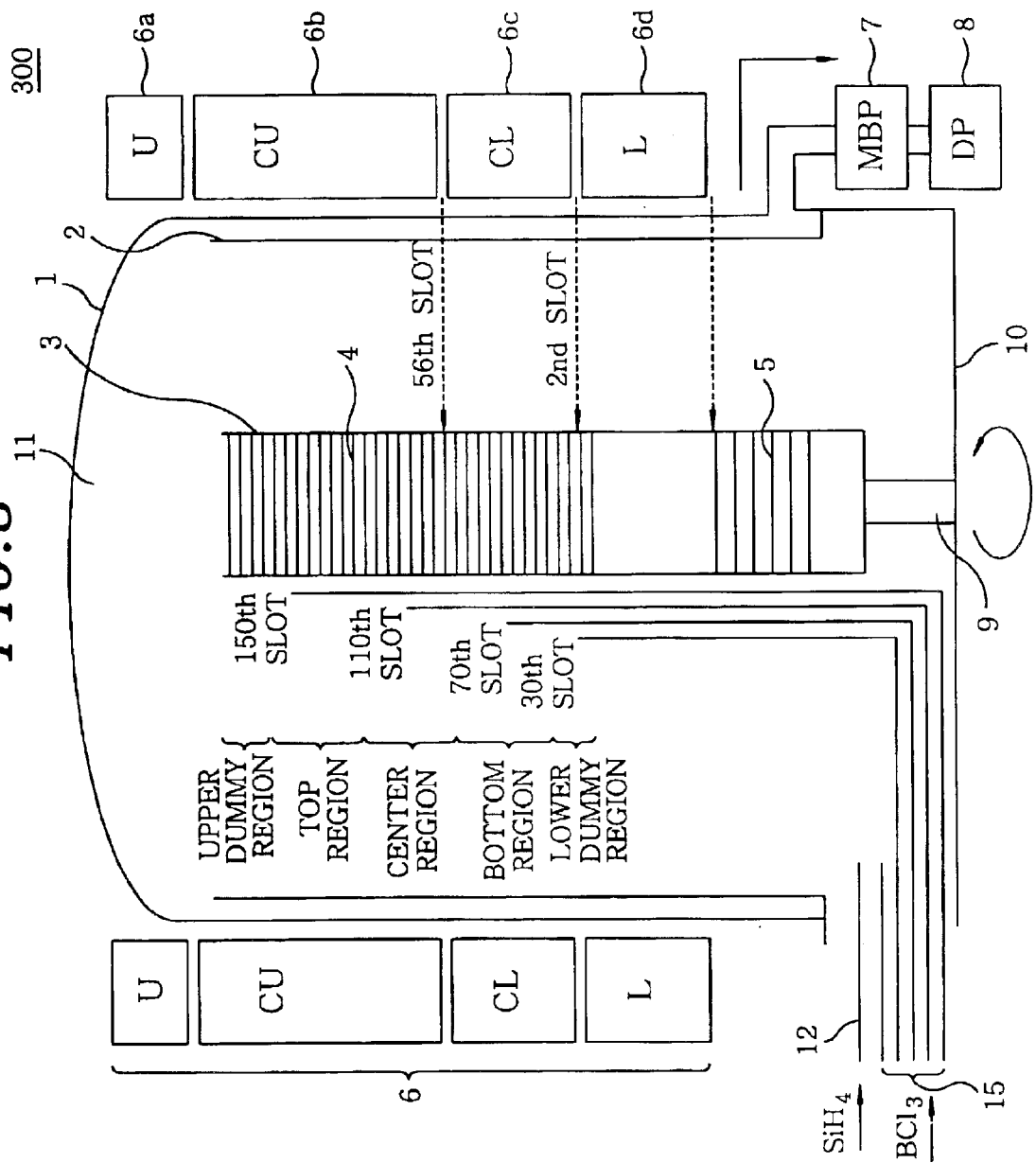
FIG. 8 describes a schematic view of another vertical batch type low pressure CVD apparatus in accordance with the present invention.

Referring to FIG. 8 there is shown a schematic view of a vertical batch type low pressure CVD apparatus 300 in accordance with a fourth preferred embodiment of the present invention. The apparatus 300 in this embodiment is similar to the apparatuses 100 and 200 of the first and the third preferred embodiment, except for a plurality of supply lines 15 having different travel lengths used for supplying $BCl_3$, which is also used as an instrumentation for controlling the partial pressure of $BCl_3$. Therefore, such aspects will now be described in detail with reference to the accompanying drawings, wherein like parts appearing FIGS. 1 and 8 are represented by like reference numerals and the description thereof is omitted for simplicity.

The $BCl_3$ supply lines 15 made of quartz were formed with different lengths. The $BCl_3$ supply lines 15 were installed in the reaction furnace 11 in such a manner that the gas was discharged at a number of spots adjacent to the boat 3, varying in vertical level.

More specifically, in FIG. 8, the number of the $BCl_3$ gas supply lines 15 was, e.g., five, and the outlets thereof were installed in the bottom region of the reaction furnace 11 together with $SiH_4$ supply line 12. The remaining $BCl_3$ gas supply lines were provided in such a manner that their outlets were disposed at different heights, e.g., evenly spaced apart from their neighboring outlets, corresponding to the 30th slot, the 70th slot, the 110th slot, and the 150th slot of the boat 3. Therefore, $BCl_3$ could be supplied to the desired spots of the reaction furnace 11, thereby enabling to control partial pressures of $BCl_3$ at varying positions in the reaction furnace 11.

The inter-wafer uniformity in specific resistance of a polysilicon film could be improved either by reducing the partial pressure of $BCl_3$ during the film forming process by way of decreasing the flow rate of $BCl_3$ or diluting $BCl_3$ or by adaptively varying the flow rates of $BCl_3$ through different supply lines 15 to tailor the spatial distribution of the partial pressure of $BCl_3$ as will be described in detail hereinbelow.

Figure 9:
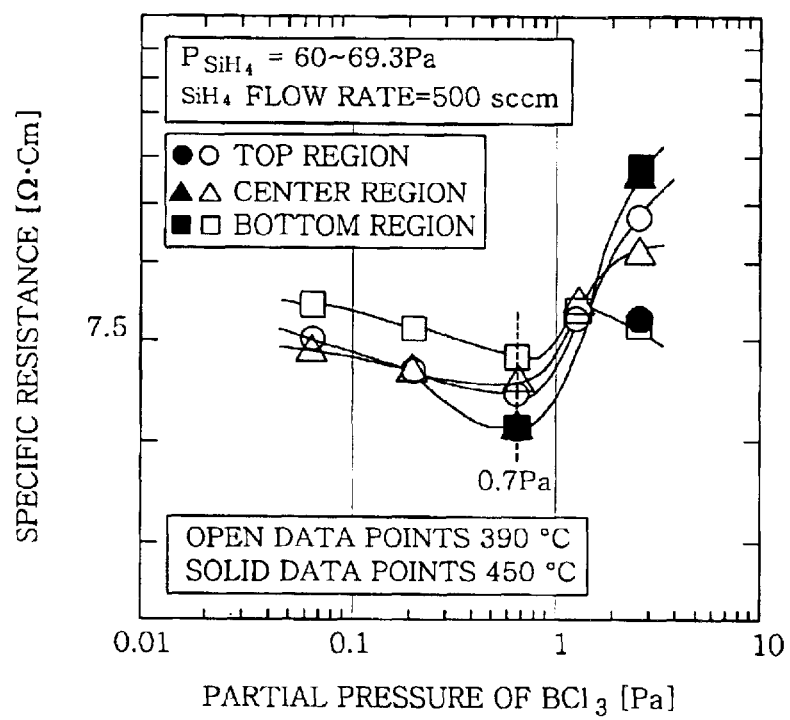
FIG. 9 discloses a graph illustrating a relationship between a specific resistance of a boron doped silicon film formed and a partial pressure of $BCl_3$.

Referring to FIG. 9, there is shown a graph illustrating a relationship between the partial pressure of $BCl_3$ and a specific resistance of a boron doped silicon film formed by using the apparatus 300. The partial pressure of $SiH_4$ ranged from about 60.0 to 69.3 Pa and the flow rate thereof was maintained at about 500 sccm. In addition, the reaction temperature was established at about 390° C. and 450° C., respectively.

As shown in FIG. 9, when the partial pressure of $BCl_3$ was about 0.7 Pa or less, e.g., between 0.06 Pa and 0.2 Pa, the specific resistance in that region tended to be smoothly varied with the partial pressure of $BCl_3$ in the given interval (i.e., slope of the curves connecting respective data points were small). However, the partial pressure of $BCl_3$ in the region beyond 0.7 Pa tended to produce abrupt increase in specific resistance (i.e., the large slope of the curves connecting respective data points). In other words, when a film forming process was carried out under the condition of the partial pressure of $BCl_3$ not greater than about 0.7 Pa, uniform inter-wafer specific resistance was achieved, despite the consumption of $BCl_3$, which generated a pressure gradient in a reaction furnace. On the other hand, when a film forming process was carried out under the condition of the partial pressure of $BCl_3$ exceeding 0.7 Pa, the consumption of $BCl_3$ produced a pressure gradient in the reaction furnace 11, which resulted in a large variation in specific resistance, thereby causing a poor uniformity in inter-wafer specific resistance.

Therefore, it was preferable to maintain a partial pressure of $BCl_3$ in a film forming process not greater than approximately 0.7 Pa, and more preferably, between about 0.06 and 0.7 Pa.

Figure 10:
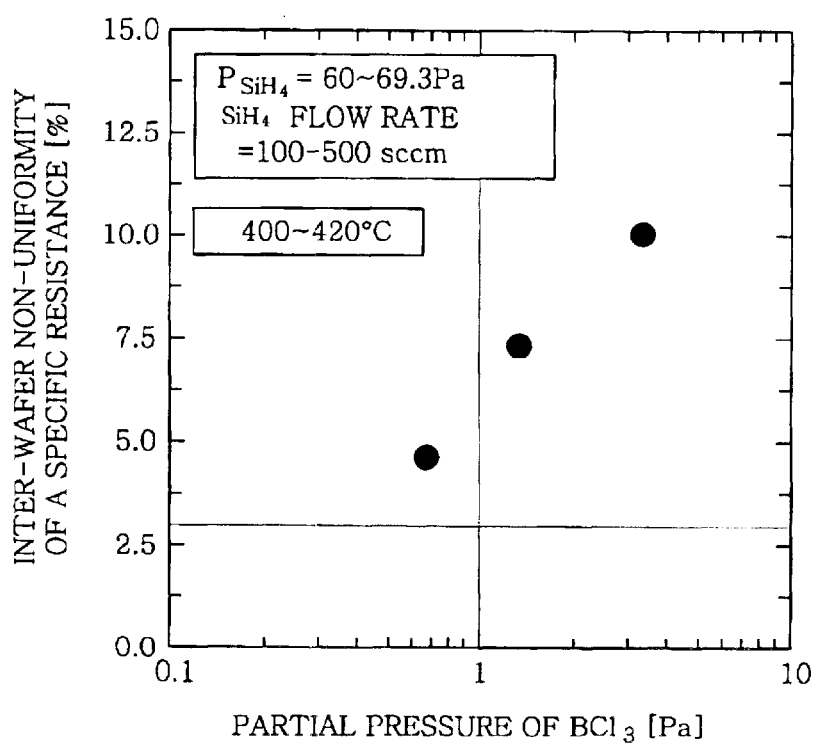
FIG. 10 represents a graph illustrating a relationship between an inter-wafer non-uniformity in specific resistance and a partial pressure of $BCl_3$.

Referring to FIG. 10, there is shown a graph illustrating a relationship between inter-wafer non-uniformity in specific resistance and partial pressure of $BCl_3$. As shown, the y-axis represents an inter-wafer non-uniformity of a specific resistance in percentage. The partial pressure of $SiH_4$ ranged from about 60.0 to 69.3 Pa and the flow rate thereof ranged from about 100 to 500 sccm, whereas the reaction temperature ranged from about 400 to 420° C., respectively.

As shown, the inter-wafer uniformity in specific resistance was improved in response to the reduction in the partial pressure of $BCl_3$.

From FIGS. 9 and 10, it can be seen that the inter-wafer non-uniformity in specific resistance was reduced from about 10% to equal to or less than about 5% (in case of 150 wafers), with an improvement of more than 50%, by reducing the partial pressure of $BCl_3$ to equal to or less than about 7 Pa. The inter-wafer non-uniformity in the specific resistance in FIG. 10 was calculated as follows: (a) subtracting a minimum value from a maximum value among mean values of the specific resistances obtained from the top, the center and the bottom region; (b) dividing the result of (a) by twice the mean value of the specific resistance obtained from the entire region; and (c) multiplying resulting value from the (b) by 100.

Furthermore, the lines 15 shown in FIG. 8, distributed its partial pressure into its respective lines 15, in which case about 0.1 Pa of $BCl_3$ was released from respective outlets of the lines 15, significantly reducing pressure gradient in the reaction wafer 11. Accordingly, inter-wafer non-uniformity in specific resistance was reduced from about 10% to less than about 4% (in case of 150 wafers), i.e., an improvement in uniformity of more than 60%.

In essence, inter-wafer non-uniformity in specific resistance was significantly reduced from about 10% to less than 5%, by reducing the partial pressure of $BCl_3$ down to 0.7 Pa or less, in which region the variation of resistance as a function of a partial pressure of $BCl_3$ was small. Furthermore, the provision of multiple supply lines, each capable of controlling the flow rate of $BCl_3$ independently, further reduced the inter-wafer non-uniformity of specific resistance.

While the present invention has been described with respect to certain preferred embodiments only, other modifications and variations may be made without departing from the scope of the present invention as set forth in the following claims.

What is claimed is:

1. A semiconductor device fabricating method, comprising the steps of:
   (a) loading a plurality of substrates held in a boat into a reaction furnace, the substrates being vertically stacked in the boat;
   (b) forming a boron doped silicon film on each of the substrates by using a thermal CVD method while supplying $SiH_4$ and $BCl_3$ into the reaction furnace; and
   (c) unloading the substrates from the reaction furnace after the step (b),
   wherein the $BCl_3$ is supplied in the step (b) from a more upstream side than a substrate held region to flow toward an opposite side thereof and, at the same time, from a plurality of spots in the substrate held region.

2. The semiconductor device fabricating method of claim 1, wherein the plurality of spots in the substrate held region varies in vertical level respectively.

3. The semiconductor device fabricating method of claim 1, wherein a plurality of insulation plates is held in the more upstream side than the substrate held region, and the $BCl_3$ is introduced from a more upstream side than a region holding the insulation plates.

4. The semiconductor device fabricating method of claim 1, wherein the $BCl_3$ which is supplied from the more upstream side than the substrate held region is introduced perpendicularly to the substrate stacked direction, and the $BCl_3$ which is supplied from the plurality of spots in a substrate held region is introduced parallel to the substrate stacked direction.

5. The semiconductor device fabricating method of claim 1, wherein $SiH_4$ is supplied in the step (b) from the more upstream side than the substrate held region to flow toward the opposite side thereof.

6. The semiconductor device fabricating method of claim 5, wherein a plurality of insulation plates is held in the more upstream side than the substrate held region, and the $BCl_3$ and the $SiH_4$ are introduced from a more upstream side than a region holding the insulation plates.

7. The semiconductor device fabricating method of claim 5, wherein the $BCl_3$ and $SiH_4$ which are supplied from the more upstream side than the substrate held region are introduced parallel to a surface of a substrate, and the $BCl_3$ which is supplied from the plurality of spots in the substrate held region is introduced perpendicularly to the surface of the substrate.

8. The semiconductor device fabricating method of claim 1, wherein the step (b) is performed at a partial pressure of $BCl_3$ in the reaction furnace not greater than 0.7 Pa.

9. The semiconductor device fabricating method of claim 1, wherein the step (b) is performed at a partial pressure of $BCl_3$ in the reaction furnace of 0.06–0.7 Pa.

10. The semiconductor device fabricating method of claim 1, wherein the step (b) is performed at a temperature in the reaction furnace of 390–450° C.

11. A semiconductor device fabricating method, comprising the steps of:
   (a) loading a plurality of substrates held in a boat into a reaction furnace, the substrates being vertically stacked in the boat;
   (b) forming a boron doped silicon film on each of the substrates by using a thermal CVD method while supplying $SiH_4$ and $BCl_3$ into the reaction furnace; and
   (c) unloading the substrates from the reaction furnace after the step (b), wherein the $BCl_3$ is supplied in the step (b) from a more upstream side than a substrate held region to flow toward an opposite side thereof and, at the same time, the $BCl_3$ is also supplied from a plurality of spots in the substrate held region through a plurality of nozzles separately.

12. The semiconductor device fabricating method of claim 11, wherein each of the nozzles differs in length.

13. The semiconductor device fabricating method of claim 11, wherein a partial pressure of $BCl_3$ in each of the spots in the reaction furnace is controlled independently.

14. The semiconductor device fabricating method of claim 11, wherein a flow rate of $BCl_3$ in each of the nozzles is controlled independently.

15. The semiconductor device fabricating method of claim 11, wherein a plurality of insulation plates is held in the more upstream side than the substrate held region, and the $BCl_3$ is introduced from a more upstream side than a region holding the insulation plates.

16. The semiconductor device fabricating method of claim 11, wherein the $BCl_3$ which is supplied from the more upstream side than the substrate held region is introduced horizontally, and the $BCl_3$ which is supplied from the plurality of spots in the substrate held region is introduced vertically.

17. The semiconductor device fabricating method of claim 11, wherein the step (b) is performed at a partial pressure of $BCl_3$ in the reaction furnace not greater than 0.7 Pa.

18. The semiconductor device fabricating method of claim 11, wherein the step (b) is performed at a partial pressure of $BCl_3$ in the reaction furnace of 0.06–0.7 Pa.

19. The semiconductor device fabricating method of claim 11, wherein the step (b) is performed at a temperature in the reaction furnace of 390–450° C.

20. A semiconductor device fabricating method, comprising the steps of:
   (a) loading a plurality of substrates held in a boat into a reaction furnace, the substrates being vertically stacked in the boat;
   (b) forming a boron doped silicon film on each of the substrates by using a thermal CVD method while supplying $SiH_4$ and $BCl_3$ into the reaction furnace; and
   (c) unloading the substrates from the reaction furnace after the step (b),
   wherein, in the step (b), the $BCl_3$ is supplied from a more upstream side than a substrate held region to flow toward an opposite side thereof and, at the same time, the $BCl_3$ is also supplied from a plurality of spots in the substrate held region through a plurality of nozzles separately, each of the nozzles having different length and the flow rate of the $BCl_3$ in each of the nozzles being controlled to maintain a partial pressure of $BCl_3$ in the reaction furnace at 0.7 Pa or less.

* * * * *